(12) United States Patent
Stark

(10) Patent No.: US 10,021,334 B2
(45) Date of Patent: Jul. 10, 2018

(54) PIXEL CIRCUIT AND METHOD OF OPERATING THE SAME

(71) Applicant: STMICROELECTRONICS (RESEARCH & DEVELOPMENT) LIMITED, Marlow (GB)

(72) Inventor: Laurence Stark, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 51 days.

(21) Appl. No.: 15/250,605

(22) Filed: Aug. 29, 2016

(65) Prior Publication Data

US 2018/0063459 A1 Mar. 1, 2018

(51) Int. Cl.
*H04N 3/14* (2006.01)
*H04N 5/335* (2011.01)
*H04N 5/378* (2011.01)
*H01L 27/146* (2006.01)
*H04N 5/374* (2011.01)

(52) U.S. Cl.
CPC ....... *H04N 5/378* (2013.01); *H01L 27/14612* (2013.01); *H01L 27/14643* (2013.01); *H04N 5/374* (2013.01)

(58) Field of Classification Search
CPC .... H04N 5/3575; H04N 5/363; H04N 5/3745; H04N 5/37457; H04N 5/378
USPC .................................................. 348/294, 308
See application file for complete search history.

(56) References Cited

U.S. PATENT DOCUMENTS

| 2010/0079632 | A1* | 4/2010 | Walschap | H04N 5/3575 348/294 |
| 2013/0327950 | A1* | 12/2013 | Niwa | G01T 1/17 250/395 |
| 2015/0055002 | A1* | 2/2015 | Beck | H04N 5/3559 348/308 |
| 2017/0180660 | A1* | 6/2017 | Xu | H04N 5/374 |

* cited by examiner

*Primary Examiner* — Anthony J Daniels
(74) *Attorney, Agent, or Firm* — Slater Matsil, LLP

(57) ABSTRACT

An embodiment circuit includes a first source follower configured to be controlled by a voltage at a first node, a photodiode controllably coupled to the first node, and a bias transistor configured to be controlled by a bias voltage. The bias transistor has a first terminal coupled to an output of the first source follower. The circuit additionally includes a storage node controllably coupled to the output of the first source follower, and an amplifier controllably coupled between the storage node and an output line. Also included in the circuit is a controllable switching element configured to couple a second terminal of the bias transistor to a supply voltage in response to a pixel operating in a first mode, and to couple the second terminal of the bias transistor to the output line in response to the pixel operating in a second mode.

33 Claims, 7 Drawing Sheets

PIXEL CIRCUIT AND METHOD OF OPERATING THE SAME

TECHNICAL FIELD

The present disclosure relates generally to electronic circuits, and, in particular embodiments, to a pixel circuit and a method of operating the same.

BACKGROUND

Image sensors using photodiode pixels may be implemented in complementary metal oxide semiconductor (CMOS) architecture. Each photodiode pixel of a CMOS image sensor may include an image sensitive element and may have associated image processing circuitry embodied in a single chip. Each photodiode pixel may also include capacitors and at least one source follower, which may function as an amplifier. Such photodiode pixels may exhibit high power consumption due to the use of capacitors and may produce signals that suffer from kTC noise associated with capacitors and random telegraph signal (RTS) noise associated with source followers. As such, photodiode pixels of a CMOS image sensor may be ineffective for certain applications or environments (e.g. low-light conditions) where at least one of a low-power operating mode or a low noise floor is desirable.

SUMMARY

According to an embodiment, a circuit includes a first source follower configured to be controlled by a voltage at a first node, a photodiode controllably coupled to the first node, and a bias transistor configured to be controlled by a bias voltage. The bias transistor has a first terminal coupled to an output of the first source follower. The circuit additionally includes a storage node controllably coupled to the output of the first source follower, and an amplifier controllably coupled between the storage node and an output line. Also included in the circuit is a controllable switching element configured to couple a second terminal of the bias transistor to a supply voltage in response to a pixel operating in a first mode, and to couple the second terminal of the bias transistor to the output line in response to the pixel operating in a second mode.

According to an embodiment, a method of operating a circuit includes controlling a first source follower using a voltage at a first node, and, in response to a pixel switching operation from a first mode to a second mode, decoupling a terminal of a capacitor from an output of the first source follower, and decoupling an output of a second source follower from an output line, the second source follower controllably coupled between the terminal of the capacitor and the output line. The method further includes coupling a source of a bias transistor to the output line. A drain of the bias transistor is tied to the output of the first source follower. The method additionally includes performing a read operation on output of the first source follower using the bias transistor as a switch configured to couple the output of the first source follower to the output line.

According to an embodiment, a circuit includes a photodiode, a first source follower controlled by a voltage at a sense node, and a transfer gate transistor configured to transfer a charge from the photodiode to the sense node. The circuit also includes a bias transistor having a first terminal coupled to an output of the first source follower, a second source follower coupled to and controlled by the output of the first source follower, and a capacitor controllably coupled between the output of the first source follower and the second source follower. The circuit additionally includes a controllable switching element configured to couple a second terminal of the bias transistor to a voltage supply line in response to a pixel operating in a first mode, and to couple the second terminal of the bias transistor to a current source in response to the pixel operating in a second mode.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Desirable characteristics of many electronic instruments include a high signal-to-noise ratio (SNR) and simplified or reduced circuitry, the latter of which can reduce cost of the instrument and provide simpler engineering. Electronic noise reduction techniques can improve signal resolution and can permit more sensitive measurements, both of which can be advantageous in many instrumental applications.

Various embodiments described herein provide a pixel circuit and a method of operating the same. The circuit provides low-noise signal readout and may be used in conditions where motion blur is the dominant motion artifact (e.g. in low-light situations). The circuit may also be used in conditions where a pixel needs to have a low noise floor, low power consumption, and high dynamic range. In particular, in various embodiments described herein, control signal noise, kTC noise associated with capacitors, and RTS noise associated with source followers are reduced or excluded from an output signal that is read out onto a column line. This may allow for a reduction of the pixel's noise floor and an increase of the dynamic range of the pixel in low-light conditions. Furthermore, capacitors may be excluded from the output signal propagation path, thereby circumventing charging and discharging of capacitors and reducing power consumption. Even further, compared to other solutions (such as a switchable capacitance-voltage-frequency solution), various embodiments achieve these effects with reduced circuit architecture.

Figure 1:
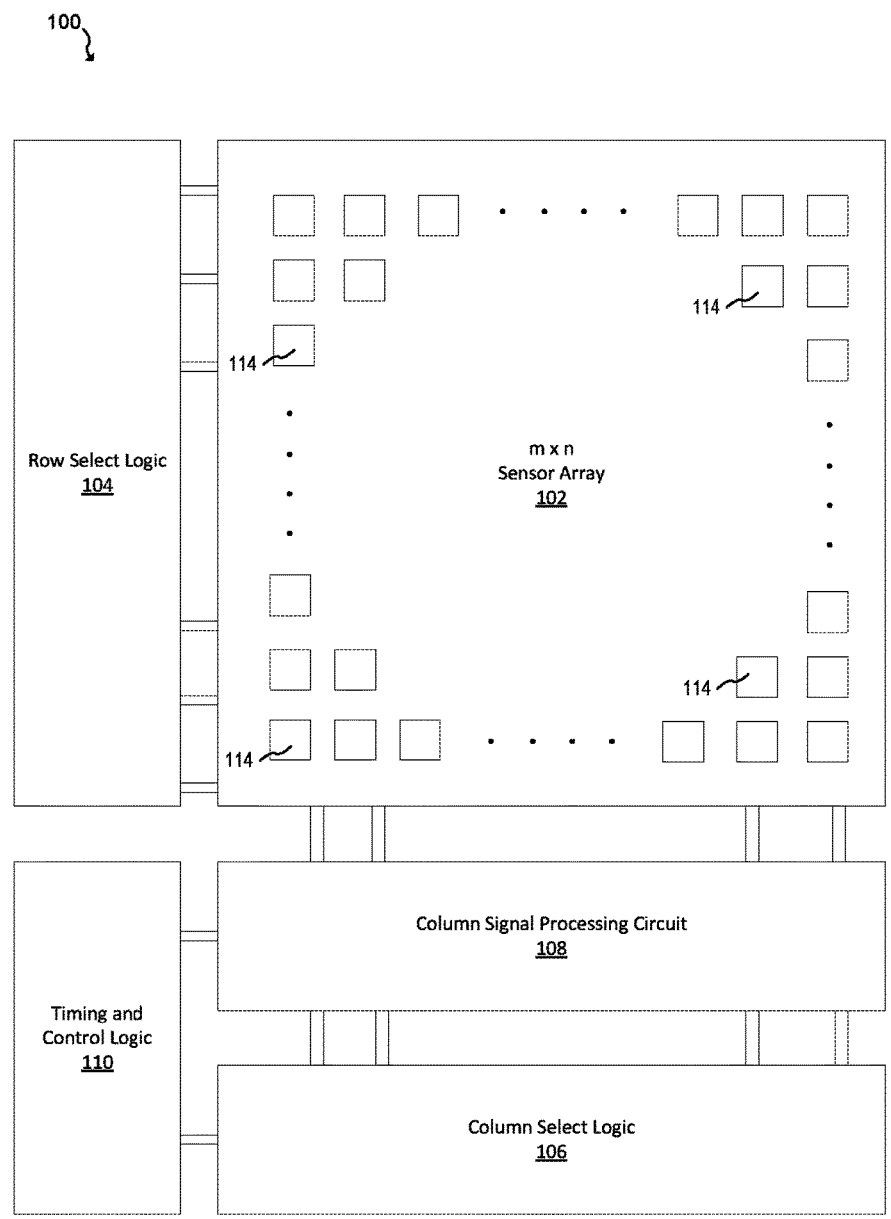
FIG. 1 shows a block diagram of a digital imaging system, in accordance with some embodiments.

FIG. 1 shows a block diagram of a digital imaging system 100, in accordance with an embodiment. In some embodiments, digital imaging system 100 may be a CMOS image sensor. Digital imaging system 100 captures light photons and converts the photons to electrical charge that is subsequently processed by circuitry included in or coupled to digital imaging system 100. The processed signal is subsequently used to reconstruct a digital image. Digital imaging system 100 may include sensor array 102, row select logic 104, column select logic 106, column signal processing circuit 108, and timing and control logic 110.

Sensor array 102 includes a plurality of pixels 114 arranged as a matrix of M rows and N columns, where M and N are whole numbers greater than 1. Each pixel 114 of the sensor array 102 may be referred to as a photo-sensitive pixel. In some embodiments, such as in an example where digital imaging system 100 is a CMOS image sensor, each pixel 114 may be referred to as an active pixel sensor (APS) pixel. Each pixel 114 includes a photo-sensitive element and associated readout and reset circuitries that are coupled communicatively and in use to the photo-sensitive element. Various implementations of pixel 114 and methods of operating pixel 114 are shown and described in more detail below in FIGS. 2-6.

Row select logic 104 includes circuitry that allows one row of the M rows of pixels 114 to be processed at one time. Column select logic 106 includes circuitry that allows one column of the N columns of pixels 114 to be selected at one time. In some embodiments, at least one of row select logic 104 or column select logic 106 may be implemented by circuitry known in the art, an example being a clock generator and a shift register (e.g. implemented by a network of inverters).

Each column of the N columns of pixels 114 in sensor array 102 may have column sensing circuitry associated with it. In other words, all M pixels 114 of a given column of pixels 114 may be coupled communicatively and in use to a respective column sensing circuitry. In some embodiments, the column sensing circuitry of a given column of pixels 114 may be included in column signal processing circuit 108. The column sensing circuitry can include circuitry for reset and readout of accumulated charge contained within each pixel 114 of a respective column of pixels 114. In an implementation, each pixel 114 of a respective column of pixels 114 may use the same electronics that perform the functions of reset and readout. In other words, each pixel 114 of a respective column of pixels 114 may share the same circuit for reset and readout. In some embodiments, column sensing circuitry of column signal processing circuit 108 may be implemented by circuitry known in the art, an example being a network of transistors coupled to each pixel 114 of a respective column of pixels 114.

Timing and control logic no controls the timing of the row select logic 104, column select logic 106, and the selection of the column signal processing circuit 108 to allow for the exposure, reset, and readout of each pixel 114 of sensor array 102. For example, in an implementation, digital imaging system 100 may operate in a global shutter mode, where an image is captured by all pixels 114 of sensor array 102 simultaneously (i.e. the integration of photons in the photo-sensitive element of each pixel 114 starts and stops at the same time). In such embodiments, each pixel 114 may be a global shutter pixel (e.g. a voltage-domain global shutter pixel), and timing and control logic no provides control signals to row select logic 104 and column select logic 106 to allow for the simultaneous exposure of all pixels 114 of sensor array 102. Following the integration of photons in the photo-sensitive element of each pixel 114, the voltage generated across each pixel 114 is read out, typically using a rolling shutter readout.

In a rolling shutter readout, the readout of pixels 114 of sensor array 102 is performed in a sequential order. For example, one row of the M rows of pixels 114 may be selected by row select logic 104 (e.g. in response to control signals being provided by timing and control logic no to row select logic 104). Pixel values of the selected row are subsequently read out for each pixel 114 of the N pixels 114 of the selected row (e.g. from left to right). In other words, the pixel values for the N columns of the selected row are read out in sequence (e.g. from left to right). The selection of each of the N pixels 114 of the selected row is performed by column select logic 106, while readout of each of the N pixels 114 of the selected row is performed by column signal processing circuit 108 (e.g. in response to control signals being provided by timing and control logic no to column select logic 106 and column signal processing circuit 108). This process can be repeated for the next row of pixels 114, and so on, until all pixels 114 of sensor array 102 have been read.

In some embodiments, digital imaging system wo may include an amplifier (not shown in FIG. 1) that amplifies the electrical signal read out from each pixel 114 (e.g. by column signal processing circuit 108). The amplifier may be included in column signal processing circuit 108. The amplified electrical signal can be used in other circuitry included in or coupled to digital imaging system 100.

Figure 2:
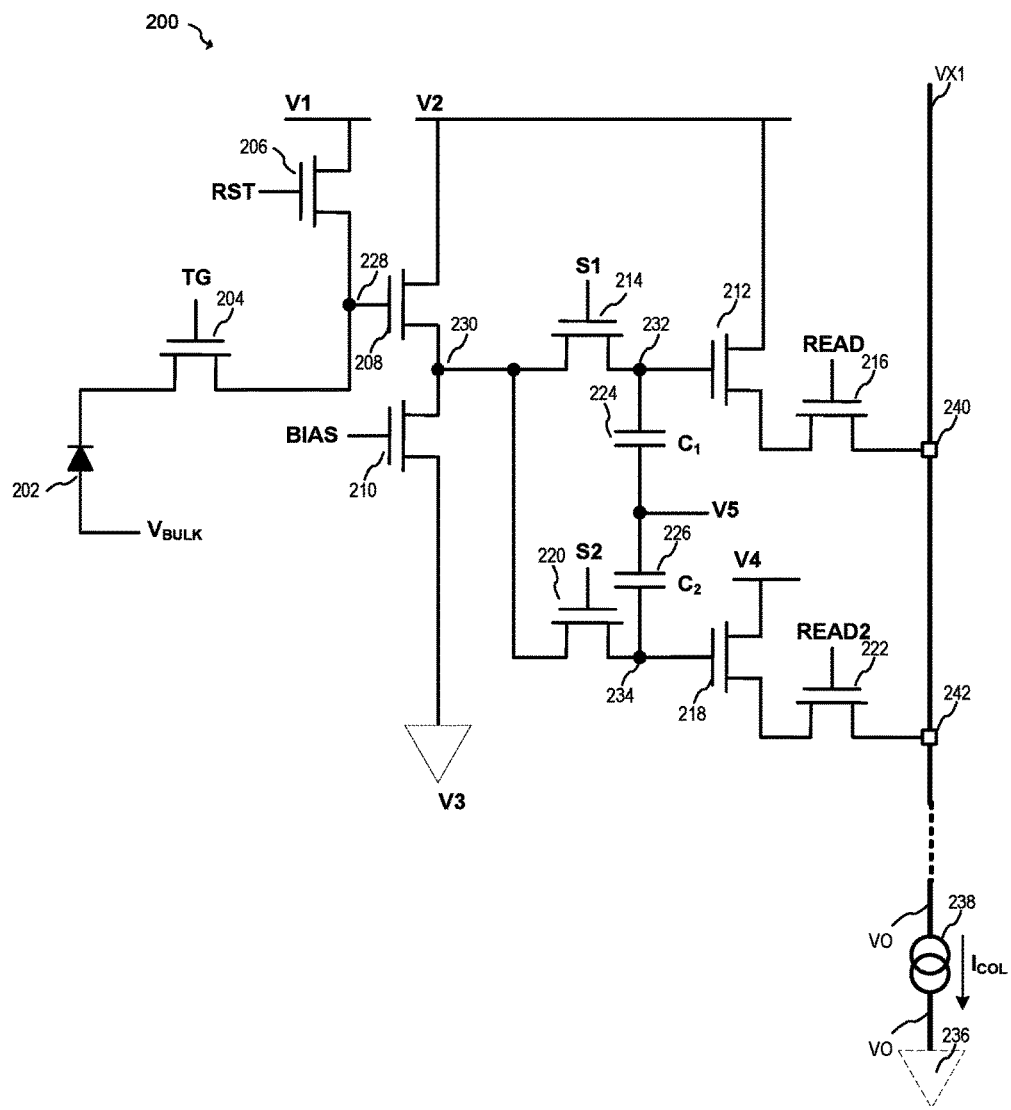
FIG. 2 schematically illustrates a pixel having CMOS architecture, in accordance with some embodiments.

FIG. 2 schematically illustrates a pixel 200 having CMOS architecture, in accordance with an embodiment. Each pixel 114 of sensor array 102 shown in FIG. 1 may be implemented by pixel 200. Pixel 200 can sometimes be referred to as a 10T CMOS pixel due to the use of ten transistors (e.g. transistors 204, 206, 208, 210, 212, 214, 216, 218, 220, and 222) in its architecture. Pixel 200 may be at least one of an APS pixel or a global shutter pixel (e.g. a voltage-domain global shutter pixel).

Pixel 200 includes photodiode 202 (e.g. a pinned photodiode) and transistors 204, 206, 208, 210, 212, 214, 216, 218, 220, and 222. Photodiode 202 is the photo-sensitive element of pixel 200. Light incident on photodiode 202 causes an accumulation (or integration) of charge within photodiode 202, which may be stored in a capacitance of photodiode 202. This, in turn, results in a voltage being generated across photodiode 202 that is representative of the charge accumulated within photodiode 202.

In an embodiment where pixel 200 is a global shutter pixel, pixel 200 includes a storage stage (which may include a storage node or a memory node, as described below) that stores the accumulated charge until it is read out. In other words, image information (e.g. accumulated charge) generated in the photodiode 202 of each pixel 200 is transferred to and temporarily stored in the storage stage of each pixel 200. The stored charge may subsequently be read out systematically (e.g. in a row-by-row manner) using a rolling shutter readout. Pixel 200 includes first capacitor 224 and second capacitor 226, which may be considered as storage stages of pixel 200. In particular, first capacitor 224 and second capacitor 226 are configured to buffer a reset voltage and a signal voltage, respectively.

The reset voltage, sometimes referred to as a black level noise offset, is the output of pixel 200 in a reset condition, where the output voltage of pixel 200 results from fixed or correlated noise sources in pixel 200 (and not from charge accumulated within photodiode 202 due to exposure to light). Examples of fixed or correlated noise sources include, but are not limited to, power supply noise, control signal noise, kTC noise associated with capacitors 224 and 226, RTS noise associated with source followers included in pixel 200, and variations in the threshold voltage of one or more of the transistors of pixel 200.

The signal voltage, on the other hand, is the output of pixel 200 in response to photodiode 202 being exposed to light. In this case, the output voltage of pixel 200 may be proportional to the number of photons captured by photodiode 202 and is, consequently, representative of the amount of charge accumulated within photodiode 202. The signal voltage also includes the black level noise offset since noise is still generated in pixel 200 even when photodiode 202 is exposed to light. As such, in order to remove, or substantially reduce, the effects of fixed or correlated noise, pixel 200 is configured to operate with correlated double sampling (CDS).

In CDS, a first measurement is made in a reset condition to measure the reset voltage (i.e. the black level noise offset), and a second measurement is made to measure the signal voltage that is generated by photodiode 202 in response to photodiode 202 being exposed to light. The reset voltage may be buffered onto first capacitor 224, while the signal voltage may be buffered onto second capacitor 226. The voltages buffered on capacitors 224 and 226 are subsequently readout. The signal voltage is subsequently subtracted from the reset voltage (e.g. by processing at column signal processing circuit 108), thereby mitigating effects associated with the black level noise offset. In some other examples, it is the reset voltage that is subtracted from the signal voltage. In either case, CDS can provide correction for correlated noise sources that may be common in both the first measurement and the second measurement.

Referring to FIG. 2, a first terminal of photodiode 202 (e.g. the anode) may be coupled to a bulk voltage $V_{BULK}$ applied to at least a portion of a substrate in which photodiode 202 is formed. In some embodiments, the bulk voltage $V_{BULK}$ may be a ground signal or a static direct current (DC) reference voltage. A second terminal of photodiode 202 (e.g. the cathode) may be coupled to a source of first transistor 204. In some embodiments, first transistor 204 may be referred to as a transfer gate transistor.

First transistor 204 may act as a switch and may be controlled by control signal TG, which is supplied to a gate of first transistor 204. Control signal TG is operable to turn first transistor 204 ON or OFF, and may be referred to as a transfer gate voltage. A drain of first transistor 204 is coupled to a source of second transistor 206. In some embodiments, second transistor 206 may be referred to as a reset transistor. A drain of second transistor 206 may be coupled to a first supply voltage V1, which is sometimes referred to as a reset voltage. The first supply voltage V1 may be a static DC reference voltage. Second transistor 206 is controlled by control signal RST, which is sometimes referred to as a reset signal. Control signal RST is supplied to a gate of second transistor 206 and is operable to turn second transistor 206 ON or OFF.

As shown in the example of FIG. 2, the source of second transistor 206 and the drain of first transistor 204 are coupled to a gate of third transistor 208 via sense node (SN) 228. Stated differently, third transistor 208 has its gate tied to SN 228, which, in turn, is tied to the source of second transistor 206 and the drain of first transistor 204. Furthermore, as shown in FIG. 2, photodiode 202 may be controllably coupled (e.g. through first transistor 204) to SN 228.

Third transistor 208 is sometimes referred to as a first source follower transistor or a sense node source follower. Since the gate of third transistor 208 is tied to SN 228, third transistor 208 is controlled by a voltage at SN 228 (sometimes referred to as "sense node voltage"). A drain of third transistor is coupled to a second supply voltage V2, which is sometimes referred to as a source follower voltage and may be a static DC reference voltage.

In some embodiments, a voltage at SN 228 can be representative of the above-described reset voltage or signal voltage. For example, when the first measurement is made in the reset condition (e.g. to buffer the reset voltage onto first capacitor 224), the voltage at SN 228 may representative of the reset voltage (i.e. the black level noise offset). As another example, when the second measurement (e.g. to buffer the signal voltage onto second capacitor 226), the voltage at SN 228 may be representative of the signal voltage.

A source of third transistor 208 (e.g. at node 230) is coupled to a third supply voltage V3 via a fourth transistor 210, which is controlled by control signal BIAS (sometimes referred to as a bias voltage). For example, the source of third transistor 208 may be coupled to (e.g. tied to) a drain of fourth transistor 210; a source of fourth transistor 210 may be coupled to (e.g. tied to) the third supply voltage V3; and control signal BIAS may be supplied to a gate of fourth transistor 210 and may be operable to turn fourth transistor 210 ON or OFF. The fourth transistor 210 may be referred to as a bias transistor, and in some embodiments, third supply voltage V3 may be a ground voltage or a static DC reference voltage. When fourth transistor 210 is turned ON, it may operate as a load for third transistor 208, and third transistor 208 may act as an amplifier (e.g. a buffer amplifier) that amplifies the voltage at SN 228 and provides the amplified voltage at node 230.

The source of third transistor 208 is also coupled to a gate of fifth transistor 212 via sixth transistor 214, which is controlled by control signal S1. Control signal S1 is supplied to a gate of sixth transistor 214 and is operable to turn sixth transistor 214 ON or OFF. A drain of fifth transistor 212 is coupled to the second supply voltage V2, and a source of fifth transistor 212 is coupled to first column line VX via seventh transistor 216. Fifth transistor 212 may act as an amplifier (e.g. a buffer amplifier) that provides an output voltage on first column line VX that is representative of the voltage at a node 232 (e.g. a storage node or memory node) between the gate of fifth transistor 212 and a drain of sixth transistor 214. In some embodiments, fifth transistor 212 is referred to as a second source follower (that is controlled by a voltage at node 232), while seventh transistor 216 is referred to as a first read transistor or a first row select transistor.

Seventh transistor 216 is controlled by control signal READ, which is operable to turn seventh transistor 216 ON or OFF. When seventh transistor 216 is turned ON, it operates as a load for fifth transistor 212, and fifth transistor 212 may act as an amplifier that can provide a voltage on first column line VX that is representative of the voltage at node 232. As such, fifth transistor 212 and seventh transistor 216 may function as an amplifier with an input tied to node 232 and an output tied to a first output node 240 coupled to (e.g. tied to) first column line VX. As shown in FIG. 2, node 232 may be controllably coupled (through sixth transistor 214) to node 230, while fifth transistor 212 is controllably coupled (through seventh transistor 216) between node 232 and output line VO.

Similarly, the source of third transistor 208 is also coupled to a gate of eighth transistor 218 via ninth transistor 220, which is controlled by control signal S2. Control signal S2 is supplied to a gate of ninth transistor 220 and is operable to turn ninth transistor 220 ON or OFF. A drain of eighth transistor 218 is coupled to a fourth supply voltage V4 (e.g. a static DC reference voltage), and a source of eighth transistor 218 is coupled to first column line VX via tenth transistor 222. Eighth transistor 218 may act as an amplifier (e.g. a buffer amplifier) that provides an output voltage on first column line VX that is representative of the voltage at a node 234 (e.g. a storage node or memory node) between the gate of eighth transistor 218 and a drain of ninth transistor 220. In some embodiments, eighth transistor 218 is referred to as a third source follower (that is controlled by a voltage at node 234), while tenth transistor 222 is referred to as a second read transistor or a second row select transistor.

Tenth transistor 222 is controlled by control signal READ2, which is operable to turn tenth transistor 222 ON or OFF. When tenth transistor 222 is turned ON, it operates as a load for eighth transistor 218, and eighth transistor 218 may act as an amplifier that can provide a voltage on first column line VX that is representative of the voltage at node 234. As such, eighth transistor 218 and tenth transistor 222 may function as an amplifier with an input tied to node 234 and an output tied to a second output node 242 coupled to (e.g. tied to) first column line VX. As shown in FIG. 2, node 234 may be controllably coupled (through ninth transistor 220) to node 230, while eighth transistor 218 is controllably coupled (through tenth transistor 222) between node 234 and output line VO.

It is noted that first column line VX is coupled to the output of each pixel 200 of a given column of the N columns of pixels 200 in sensor array 102. A lower limit of the voltage on first column line VX may be dictated by column current source 238, which is coupled to the first column line VX via output line VO. In some embodiments, output line VO and column current source 238 which may be included in column signal processing circuit 108.

As shown in FIG. 2, node 232 is coupled node 234 via first capacitor 224 and second capacitor 226. In particular, a first terminal of first capacitor 224 is tied to node 232; a second terminal of first capacitor 224 is tied to a first terminal of second capacitor 226; and a second terminal of second capacitor 226 is tied to node 234. In some embodiments, such as in the example shown in FIG. 2, a fifth supply voltage V5 (e.g. a static DC reference voltage) is applied to the second terminal of first capacitor 224 and the first terminal of second capacitor 226. In the example of FIG. 2, sixth transistor 214 and first capacitor 224 are considered to be a first storage stage, while ninth transistor 220 and second capacitor 226 are considered to be a second storage stage.

During operation of pixel 200, transistors 204, 206, 208, 210, 212, 214, 216, 218, 220, and 222 are turned ON and OFF in a prescribed manner. As an example, timing and control logic 110 may turn ON and OFF transistors 204, 206, 208, 210, 212, 214, 216, 218, 220, and 222 in a predetermined sequence using control signals TG, RST, BIAS, S1, S2, READ, and READ2. An example of the operation of pixel 200 is described below in reference to FIG. 3.

Figure 3:
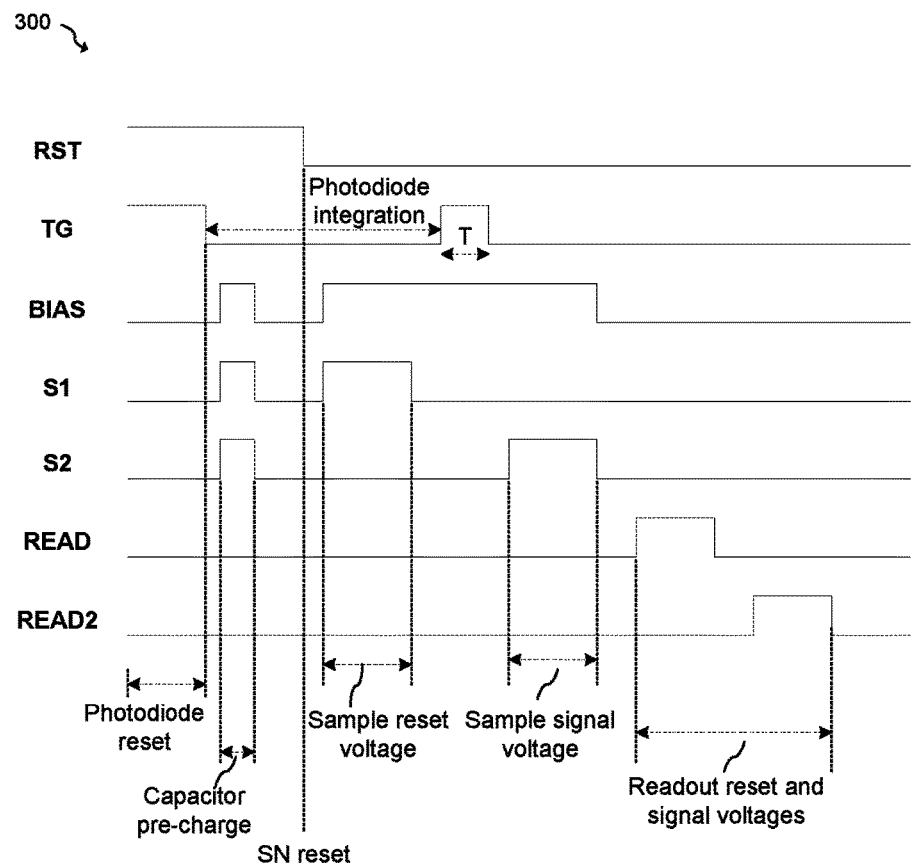
FIG. 3 shows a simplified timing diagram for the pixel shown in FIG. 2, in accordance with some embodiments.

FIG. 3 shows a simplified timing diagram 300 for pixel 200 shown in FIG. 2. Timing diagram 300 shows control signals RST, TG, BIAS, S1, S2 READ, and READ2. In the example shown in FIGS. 2 and 3, a transistor may be turned OFF or ON by setting a corresponding control signal to a LOW voltage or HIGH voltage, respectively. However, in some other embodiments (e.g. where transistors 204, 206, 208, 210, 212, 214, 216, 218, 220, and 222 are implemented using PMOS transistors), a transistor may be turned OFF or ON by setting a corresponding signal to a HIGH voltage or LOW voltage, respectively. In some examples, control signals RST, TG, BIAS, S1, S2, READ, and READ2 may be provided to pixel 200 by at least one of row select logic 104, column select logic 106, and timing and control logic 110.

Photodiode 202 can operate in at least three states, including photodiode reset, photodiode integration, and photodiode sampling. When photodiode 202 is operating in the reset state (indicated in FIG. 3 as "photodiode reset"), first transistor 204 and second transistor 206 are turned ON by control signals TG and RST, respectively. As shown in FIG. 3, control signals BIAS, S1, S2, READ, and READ2 are held at a LOW voltage during photodiode reset, thereby turning or keeping OFF transistors 210, 214, 216, 220, and 222.

In response to first transistor 204 and second transistor 206 being turned ON and other transistors 210, 214, 216, 220, and 222 being OFF, photodiode 202 is charged to a reverse bias voltage. This may be accomplished by bringing the second terminal of photodiode 202 to a voltage substantially equal to first supply voltage V1 minus the drain-to-source voltage drop across first transistor 204 minus the drain-to-source voltage drop across second transistor 206. The voltage at the second terminal of photodiode 202 is greater than the voltage at the first terminal of photodiode 202 (i.e. bulk voltage $V_{BULK}$), and the photodiode 202 is in reverse bias mode. This may result in the removal of accumulated electron-hole pairs within photodiode 202 and may widen the depletion region of photodiode 202, thereby improving charge collection efficiency during the next charge integration process.

Following photodiode reset, control signal TG transitions from a HIGH voltage to a LOW voltage, while control signals BIAS, S1, S2, READ, and READ2 are held at a LOW voltage. As a result, first transistor 204 is turned OFF, while transistors 210, 214, 216, 220, and 222 are kept in the OFF state. In the example shown in FIG. 3, second transistor 206 is kept ON by control signal RST when control signal TG transitions from a HIGH voltage to a LOW voltage. Consequently, photodiode 202 operates in the integration state (indicated in FIG. 3 as "photodiode integration"). Since first transistor 204 is turned OFF, photodiode 202 is isolated from the remaining circuitry of pixel 200 and is forward biased, thereby allowing photo-generated charges to accumulate within photodiode 202.

While photodiode 202 is operating in the integration state, fourth transistor 210, sixth transistor 214, and ninth transistor 220 may be turned ON by control signals BIAS, S1, and S2, respectively. Control signal RST is kept HIGH, while control signal TG is kept LOW. This may have the effect of pre-charging first capacitor 224 and second capacitor 226 (indicated in FIG. 3 as "capacitor pre-charge"). Following pre-charging of first capacitor 224 and second capacitor 226, control signals BIAS, S1, and S2 turn OFF fourth transistor 210, sixth transistor 214, and ninth transistor 220, respectively.

After first capacitor 224 and second capacitor 226 have been pre-charged, second transistor 206 may be turned OFF by control signal RST, thereby resetting SN 228 (indicated in FIG. 3 as "SN reset"). As shown in the example of FIG.

3, control signals TG, BIAS, S1, S2, READ, and READ2 are held at a LOW voltage when control signal RST transitions from a HIGH voltage to a LOW voltage, thereby keeping transistors 204, 210, 214, 216, 220, and 222 in the OFF state. In response to second transistor 206 being turned OFF and transistors 204, 210, 214, 216, 220, and 222 being kept in the OFF state, SN 228 may be set at a voltage representative of the black level noise offset of pixel 200.

Following reset of SN 228, fourth transistor 210 and sixth transistor 214 are turned ON by control signals BIAS and S1, respectively, while transistors 204, 206, 216, 220, and 222 remain OFF. Consequently, third transistor 208 may amplify the voltage at SN 228, and the amplified voltage (e.g. provided at node 230) may be buffered onto first capacitor 224 as the above-described black level noise offset. Following the storage of black level noise offset in first capacitor 224, sixth transistor 214 is turned OFF by control signal S1. This sequence of steps is indicated in FIG. 3 as "sample reset voltage." In some examples, such as in FIG. 3, fourth transistor 210 continues to be ON following storage of black level noise offset in first capacitor 224.

Subsequently, photodiode sampling occurs where a representative voltage corresponding to the charge accumulation within photodiode 202 is sampled and buffered onto second capacitor 226. In other words, during photodiode sampling, the above-described signal voltage is sampled and buffered onto second capacitor 226. In particular, first transistor 204 is turned ON, for a predetermined period of time T, by control signal TG, while transistors 206, 214, 216, 220, and 222 remain OFF. As a result, charges accumulated within photodiode 202 are transferred to SN 228, which may, consequently, be set at a representative voltage corresponding to the charge accumulation within photodiode 202. As shown in FIG. 3, fourth transistor 210 remains ON while first transistor 204 is turned ON for the predetermined period of time T.

Following transfer of charges to SN 228, first transistor is turned OFF by control signal TG. Subsequently, ninth transistor 220 is turned ON by control signal S2, while transistors 204, 206, 214, 216, 220, and 222 remain OFF. Consequently, third transistor 208 may amplify the voltage at SN 228, and the amplified voltage (e.g. provided at node 230) may be buffered onto second capacitor 226 as the above-described signal voltage. Following the storage of signal voltage in second capacitor 226, ninth transistor 220 and fourth transistor 210 are turned OFF by control signals S2 and BIAS, respectively. This sequence of steps is indicated in FIG. 3 as "sample signal voltage."

The voltages buffered onto first capacitor 224 and second capacitor 226 need to be driven onto first column line VX. In other words, the voltages across first capacitor 224 and second capacitor 226 need to be read out. As such, following buffering of black level noise offset and the signal voltage, these voltages are driven onto first column line VX by controlling operation of seventh transistor 216 and tenth transistor 222. Control signals READ and READ2 may turn ON seventh transistor 216 and tenth transistor 222, respectively. In some embodiments, control signals READ and READ2 may be referred to as row select signals and may be provided by row select logic 104.

As shown in FIG. 3, black level noise offset, buffered onto first capacitor 224, is read out by turning ON seventh transistor 216, while keeping transistors 204, 206, 210, 214, 220, and 222 in the OFF state. At this stage, fifth transistor 212 (i.e. second source follower) may act as an amplifier that provides an output voltage on first column line VX that is representative of the black level noise offset. Similarly, signal voltage, buffered onto second capacitor 226, is read out by turning ON tenth transistor 222, while keeping transistors 204, 206, 210, 214, 216, and 220 in the OFF state. At this stage, eighth transistor 218 (i.e. third source follower) may act as an amplifier that provides an output voltage on first column line VX that is representative of the signal voltage. As shown in FIG. 2, the voltages (e.g. reset voltage and signal voltage) read out on first column line VX may be amplified by amplifier 236, which may be included in column signal processing circuit 108. This sequence of steps is indicated in FIG. 3 as "readout reset and signal voltages."

As described above in relation to FIG. 1, a rolling shutter readout may be used for the readout of pixels 114 of sensor array 102. In such an embodiment, during a row access period of the $i^{th}$ row of sensor array 102, the pixels 200 of the $i^{th}$ row may be selected by raising a row select signal (e.g. control signal READ and/or control signal READ2). This may allow seventh transistor 216 and tenth transistor 222 of each pixel 200 in the $i^{th}$ row to connect their respective source followers 212 and 218 to first column line VX. The reset voltages and the signal voltages of pixels 200 of the $i^{th}$ row may be readout sequentially, for example, from left to right. Upon completion of readout, capacitors 224 and 226 of each pixel 200 of the $i^{th}$ row can be used to buffer new voltages thereon, e.g. during the next row access period of the $i^{th}$ row.

Based on the above-described operation of pixel 200, an output signal propagation path for a voltage at SN 228 that is representative of the reset voltage includes first source follower 208, a charging of first capacitor 224, a subsequent discharging of first capacitor 224, second source follower 212, and seventh transistor 216 that acts as a load for second source follower 212. Similarly, an output signal propagation path for a voltage at SN 228 that is representative of the signal voltage includes first source follower 208, a charging of second capacitor 226, a subsequent discharging of second capacitor 226, third source follower 218, and tenth transistor 222 that acts as a load for third source follower 218.

In both these cases, the output signal propagation path introduces, to the voltage read out onto first column line VX, power supply noise associated with supply voltages V1, V2, V3, V4, and V5, control signal noise associated with control signals S1, S2, READ, and READ2, kTC noise associated with capacitors 224 and 226, and RTS noise associated with source followers 208, 212, and 218. These sources of noise in pixel 200 may contribute to the noise floor of pixel 200.

Additionally, drain-to-source voltage drops that occur over each of source followers 208, 212, and 218 may reduce a dynamic range of pixel 200. The dynamic range of pixel 200 may further be reduced by the gain imparted by source followers 208, 212, and 218 to voltages propagated along the above-described signal paths.

Even further, power consumption of pixel 200 may be high due, at least in part, to capacitors 224 and 226 having large capacitance values and being charged and discharged during operation of pixel 200 (e.g. as described above in relation to FIG. 3). As an example, capacitors 224 and 226 may have a capacitance between about 5 femtofarads (fF) and about 30 fF (e.g. when pixel 200 has a dimension less than about 10 micrometers). As another example, capacitors 224 and 226 may have a capacitance up to about 150 fF (e.g. when pixel 200 has a dimension greater than or equal to about 10 micrometers).

The high noise floor, high power consumption, and reduced dynamic range of pixel 200 (e.g. relative to a rolling shutter pixel) may be intrinsic to pixel 200 and may render pixel 200 ineffective for certain applications or environments (e.g. in low-light conditions), where a low-power operating mode and a low noise floor are desirable. For example, under low-light conditions, it may be desirable to assure that the magnitude of a photo-generated signal (e.g. signal voltage) is greater than the noise floor of pixel 200 so that a decent signal-to-noise ratio (SNR) may be achieved.

One method for increasing the SNR (e.g. in low-light conditions) is to have a long exposure time for sensor array 102 (e.g. greater than about 5 milliseconds) in order to increase the number of photons captured by photodiode 202. However, when pixels 114 of sensor array 102 are subjected to long exposure times, image blurring caused by the long exposure times may outweigh rolling shutter motion artifacts (e.g. wobble, skew, smear, and partial exposure, which global shutter sensors are designed to suppress). Generally, exposure times of greater than about 5 milliseconds are when blurring artifacts become noticeable. Additionally or optionally, the SNR (e.g. under low-light conditions) may be increased by performing a low noise readout where noise along a signal propagation path is reduced, thereby reducing the noise floor of pixel 200.

Some global shutter image sensors may implement low noise readout by having a sensor at SN 228 that has a switchable capacitance-voltage-frequency (CVF). However, such an approach requires additional chip real estate (i.e. extra area) for the additional capacitors and switches at SN 228. Additionally, pixel 200 with the switchable CVF has increased power consumption (e.g. due to additional circuitry). As such, these approaches may render pixel 200 ineffective for certain applications or environments where a low-power operating mode and a low noise floor (e.g. about 1-2 electrons) are desirable.

Figure 4A:
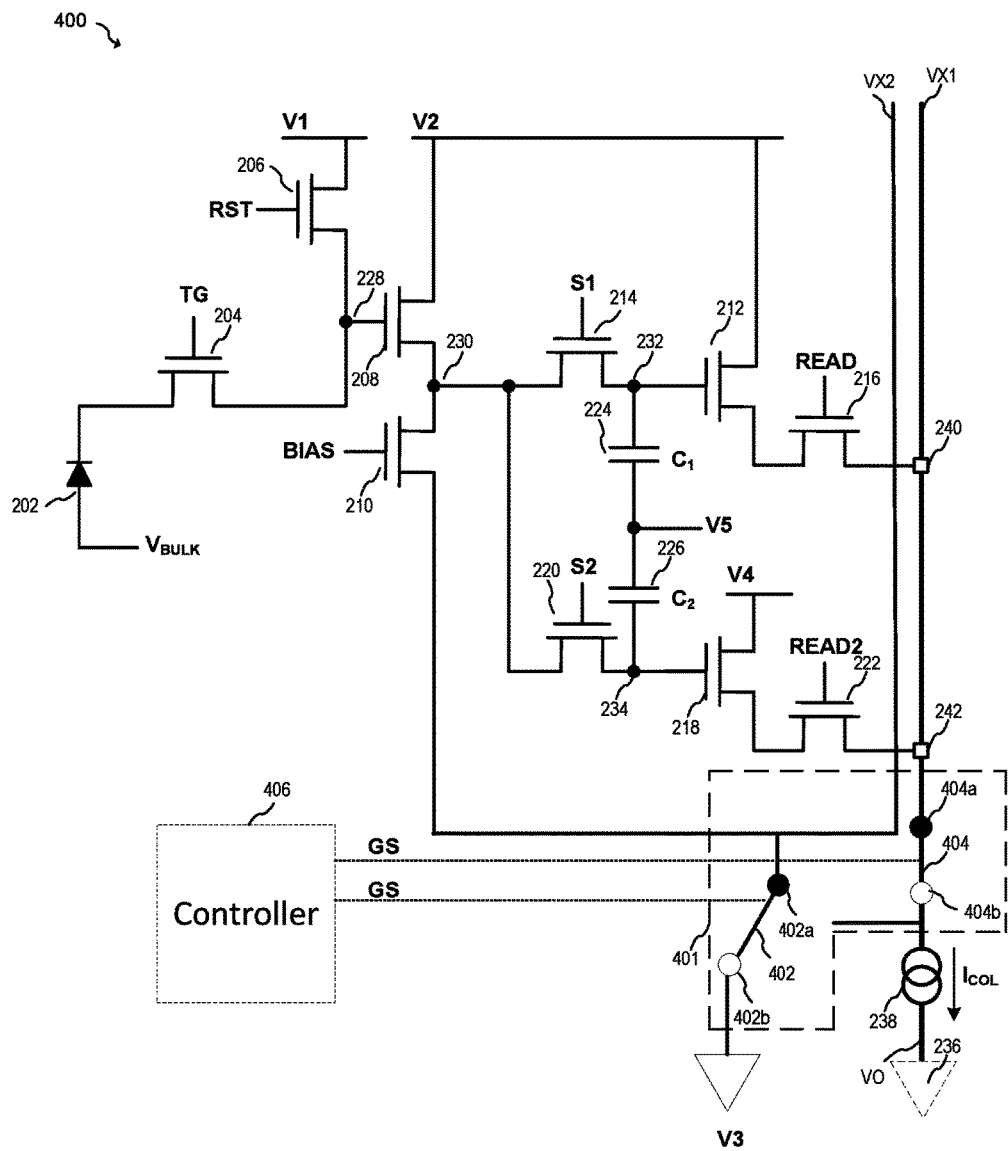
FIGS. 4A and 4B schematically illustrate a circuit, including a pixel having CMOS architecture, a two column lines, a first controllable switching element, and a controller, in accordance with some embodiments.
Figure 4B:
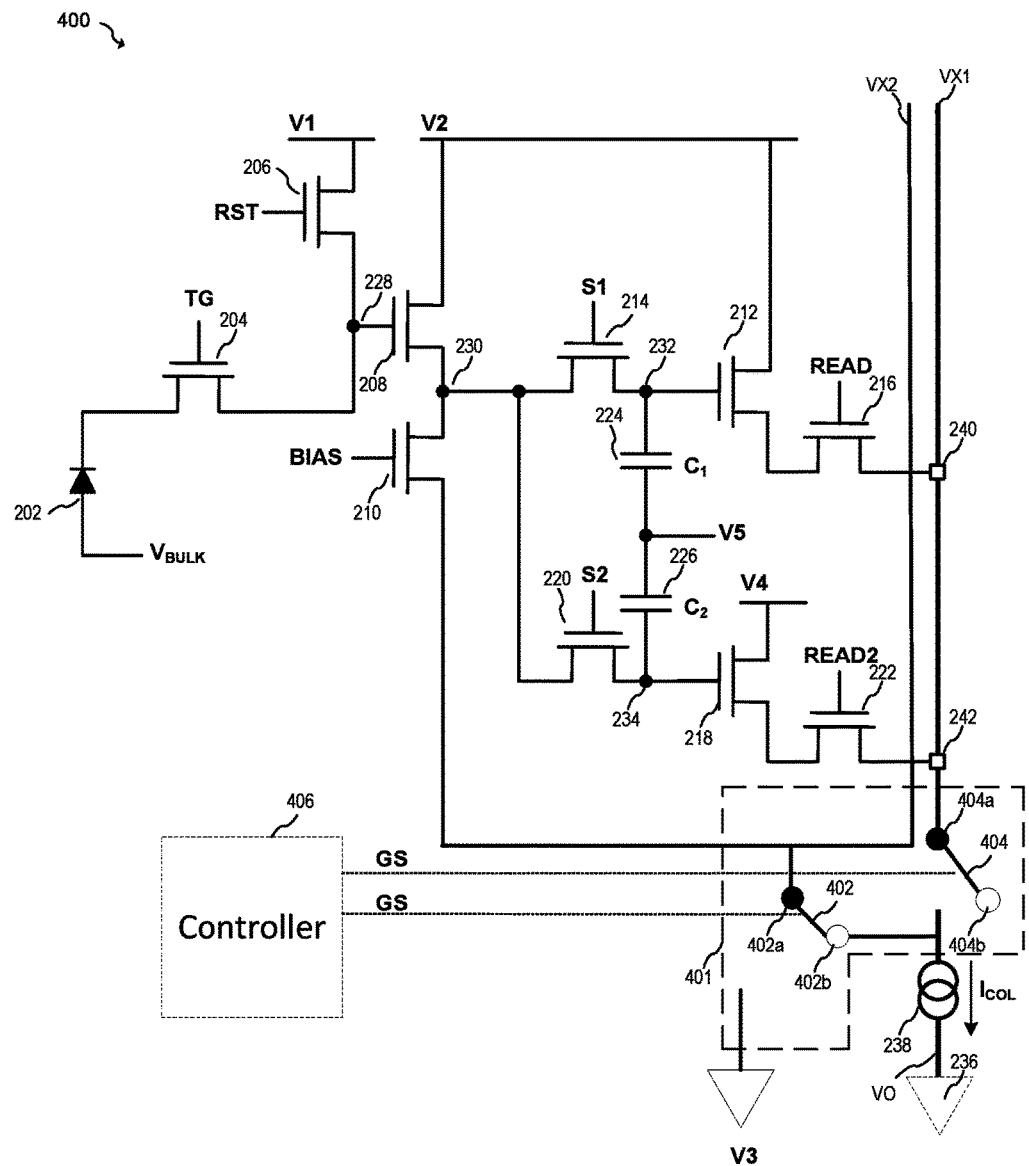

FIGS. 4A and 4B schematically illustrate a circuit 400, including a pixel having CMOS architecture, a first controllable switching element 401, a second column line VX2, and a controller 406, in accordance with an embodiment. Corresponding numerals and symbols in FIGS. 2, 4A, and 4B generally refer to corresponding parts; reference is made to the description given above in relation to FIG. 2 for the sake of brevity. In some embodiments, each pixel 114 of sensor array 102 shown in FIG. 1 may be implemented by the CMOS pixel shown in FIGS. 4A and 4B, while first controllable switching element 401 and controller 406 may be included in column signal processing circuit 108 or column select logic 106. Circuit 400 may be used in digital imaging system 100 in order to achieve a low noise floor (e.g. between about 1 electron and about 2 electrons), low power consumption, and high dynamic range in certain applications or environments (e.g. in low-light conditions).

Pixels 114 of sensor array 102 may operate in a first mode or a second mode (different from the first mode). As an example, the first mode of pixels 114 may be a global shutter mode where an image is captured by all pixels 114 of sensor array 102 simultaneously. On the other hand, the second mode may be a rolling shutter readout mode where charge stored in pixels 114 of sensor array 102 are read out systematically (e.g. in a row-by-row manner, as described above in relation to FIGS. 2 and 3).

First controllable switching element 401 may be controlled by controller 406 and configured to couple the source of fourth transistor 210 to third supply voltage V3 when pixels 114 operate in the first mode. When pixels 114 operate in the second mode, first controllable switching element 401 may be configured to decouple the source of fourth transistor 210 from third supply voltage V3 and to, instead, couple the source of fourth transistor 210 to output line VO (or to column current source 238). In more detail, in response to pixels 114 of sensor array 102 operating in the first mode, first controllable switching element 401 may be configured to couple the source of fourth transistor 210 to third supply voltage V3 and to couple the sources of transistors 216 and 222 to output line VO (or to column current source 238). On the other hand, in response to pixels 114 of sensor array 102 operating in the second mode, first controllable switching element 401 may be configured to couple the source of fourth transistor 210 to output line VO (or to column current source 238) and to decouple the sources of transistors 216 and 222 from output line VO (or from column current source 238).

In the example shown in FIGS. 4A and 4B, first controllable switching element 401 includes first switch 402 and second switch 404, which enable it to couple the source of fourth transistor 210 to third supply voltage V3 and to output line VO (or to column current source 238) when pixels 114 operate in the first mode and the second mode, respectively. Each of first switch 402 and second switch 404 may be a programmable switch. First switch 402 and second switch 404 may be communicatively coupled to controller 406. Controller 406 may be configured to change a position of each of first switch 402 and second switch 404 (e.g. using control signal GS) in response to pixels 114 of sensor array 102 switching operation between the first mode and the second mode.

A first terminal 402a of first switch 402 may be coupled, via second column line VX2, to the source of fourth transistor 210 of each pixel 114 of a given column of the N columns of pixels 114 in sensor array 102. Second column line VX2 may be referred to as a voltage supply line since a second terminal 402b of first switch 402 may be coupled to (e.g. tied to) third supply voltage V3 in response to pixel 114 operating in the first mode (e.g. as shown in FIG. 4A). On the other hand, second terminal 402b of first switch 402 may be coupled to (e.g. tied to) output line VO (or to column current source 238) in response to pixel 114 operating in the second mode (e.g. as shown in FIG. 4B).

A first terminal of second switch 404 may be coupled, via first column line VX, to the sources of transistors 216 and 222 of each pixel 114 of a given column of the N columns of pixels 114 in sensor array 102. A second terminal 404b of second switch 404 may be coupled to output line VO (or to column current source 238) in response to pixel 114 operating in the first mode (e.g. as shown in FIG. 4A). On the other hand, second switch 404 may be configured to be open in response to pixel 114 operating in the second mode (e.g. as shown in FIG. 4B). As such, as depicted in FIG. 4B, in the second mode, output line VO (or column current source 238) may be decoupled from first column line VX and from the sources of transistors 216 and 222. Instead, output line VO (or column current source 238) may be coupled, via second column line VX2, to the source of fourth transistor 210 of each pixel 114 of a given column of the N columns of pixels 114 in sensor array 102.

Figure 5:
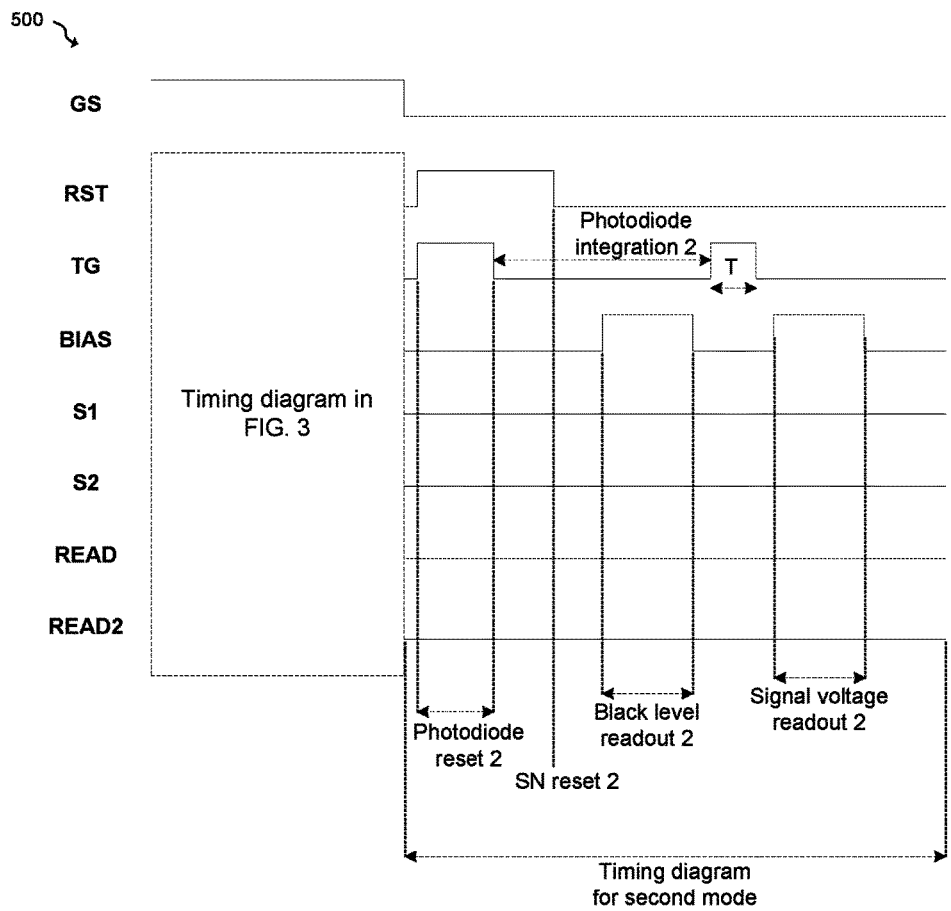
FIG. 5 shows a simplified timing diagram for the circuits shown in FIGS. 4A and 4B, in accordance with some embodiments.

FIG. 5 shows a simplified timing diagram 500 for circuit 400 shown in FIGS. 4A and 4B, in accordance with an embodiment. When pixels 114 of sensor array 102 operate in the first mode, controller 406 sets control signal GS to a first level (e.g. HIGH voltage) and provides control signal GS to first switch 402 and second switch 404. In some embodiments, the setting of control signal GS to the first level may be triggered by pixels 114 of sensor array 102 operating in or switching operation to the first mode. In response to receiving control signal GS having the first level, first switch 402 couples, via second column line VX2, the source of fourth transistor 210 of each pixel 114 of a given column of the N columns of pixels 114 to third supply voltage V3 (e.g. as shown in FIG. 4A). Additionally, second switch 404 couples output line VO (or column current source 238), via first column line VX, to the sources of read transistors 216 and 222 of each pixel 114 of a given column of the N columns of pixels 114. As such, the circuit 400 has the arrangement shown in FIG. 4A. Control signals TG, RST, BIAS, S1, S2, READ, and READ2 are provided to the circuit arrangement shown in FIG. 4A according to the timing diagram shown in FIG. 3. As such, circuit 400 shown in FIG. 4A is configured to operate as described above in relation to FIGS. 2 and 3. Reference is made to the description above in relation to FIGS. 2 and 3 for the sake of brevity.

On the other hand, when pixels 114 of sensor array 102 operate in the second mode, controller 406 sets control signal GS to a second level (e.g. LOW voltage) different from the first level. Control signal GS having the second level is provided (e.g. by controller 406) to first switch 402 and second switch 404. In some embodiments, the setting of control signal GS to the second level may be triggered by pixels 114 of sensor array 102 operating in or switching operation to the second mode. In response to receiving control signal GS having the second level, first switch 402 couples the source of fourth transistor 210 to output line VO (or to column current source 238), while second switch 404 decouples output line VO (or column current source 238) from first column line VX (e.g. as shown in FIG. 4B). As such, third supply voltage V3 is no longer tied to the source of fourth transistor 210. Furthermore, read transistors 216 and 222 are no longer tied to output line VO (or to column current source 238).

Referring to FIG. 5, when pixels 114 of sensor array 102 operate in the second mode, control signals READ and READ2 are held at a LOW voltage, thereby disconnecting the output of source followers 212 and 218 from the first column line VX. Additionally, control signals S1 and S2 are held at a LOW voltage, effectively disconnecting capacitors 224 and 226 from the output of third transistor 208 (i.e. first source follower). As such, circuit 400 shown in FIG. 4B may be operated as a 4T CMOS pixel, where the transistors used for reset, exposure, and readout are first transistor 204, second transistor 206, third transistor 208, and fourth transistor 210 (which functions as a read-enable transistor of the 4T CMOS pixel).

In the circuit 400 shown in FIG. 4B, photodiode 202 is operated in the reset state, integration state, and sampling state. When photodiode 202 operates in the reset state (indicated in FIG. 5 as "photodiode reset 2"), first transistor 204 and second transistor 206 are turned ON by control signals TG and RST, respectively. As shown in FIG. 5, control signal BIAS is held low, thereby turning or keeping OFF fourth transistor 210. In response to first transistor 204 and second transistor 206 being ON and fourth transistor 210 being OFF, photodiode 202 is charged to a reverse bias voltage, as described above in relation to "photodiode reset" in FIG. 3.

Following photodiode reset, photodiode 202 operates in the integration state (indicated in FIG. 5 as "photodiode integration 2") by turning first transistor 204 OFF using control signal TG, thereby electrically isolating photodiode 202 from the remaining circuitry. In the example shown in FIG. 5, when control signal TG transitions from a HIGH voltage to a LOW voltage, second transistor 206 is kept ON by control signal RST and fourth transistor 210 is kept OFF by control signal BIAS. As a result of first transistor 204 being turned OFF, second transistor 206 being ON, and fourth transistor 210 being OFF, photodiode 202 can be forward biased, thereby allowing photodiode 202 to accumulate photo-generated charges.

While photodiode 202 operates in the integration state, second transistor 206 may be turned OFF by control signal RST, thereby resetting SN 228 (indicated in FIG. 5 as "SN reset 2"). It is noted that transistors 204 and 210 remain OFF when SN 228 is reset. In other words, in response to second transistor 206 being turned OFF and transistors 204 and 210 remaining OFF, SN 228 may be set at a voltage representative of the black level noise offset of the pixel in circuit 400.

During photodiode integration and after resetting SN 228, fourth transistor 210 may be turned ON by control signal BIAS (e.g. by transitioning control signal BIAS from a LOW voltage to a HIGH voltage). As shown in FIG. 5, first transistor 204 and second transistor 206 remain OFF when fourth transistor 210 is turned ON. Consequently, third transistor 208 may amplify the voltage at SN 228, and the amplified voltage (e.g. provided at node 230) may be read out onto second column line VX2 as the black level noise offset. Following readout of the black level noise offset onto second column line VX2, fourth transistor 210 may be turned OFF by control signal BIAS. This sequence of steps is indicated in FIG. 5 as "black level readout 2."

Following photodiode integration, photodiode sampling occurs where a representative voltage corresponding to the charge accumulation within photodiode 202 is read out onto second column line VX2. In particular, first transistor 204 is turned ON by control signal TG for a predetermined time T, while second transistor 206 and fourth transistor 210 remain OFF. As a result, charges accumulated within photodiode 202 may be transferred to SN 228, consequently setting SN 228 at a voltage representative of the charge accumulated within photodiode 202. Fourth transistor 210 is subsequently turned ON by control signal BIAS. As shown in FIG. 5, first transistor 204 and second transistor 206 remain OFF when fourth transistor 210 is turned ON. As such, third transistor 208 amplifies the voltage at SN 228, and the amplified voltage (e.g. provided at node 230) may be read out onto second column line VX2 as the signal voltage. Following readout of the black level noise offset onto second column line VX2, fourth transistor 210 may be turned OFF by control signal BIAS. This sequence of steps is indicated in FIG. 5 as "signal voltage readout."

Based on the above-described operation of circuit 400 shown in FIG. 4B, the output signal propagation path for voltages at SN 228 that are representative of the reset and signal voltages includes first source follower 208 and fourth transistor 210 that acts as a load for first source follower 208. Consequently, transistors 212, 214, 216, 218, 220, 222, and capacitors 224 and 226 are excluded from the output signal propagation path. As a result, control signal noise associated with control signals S1, S2, READ, and READ2, kTC noise associated with capacitors 224 and 226, and RTS noise associated with source followers 208, 212, and 218 are reduced or excluded from the output signal that is read out onto second column line VX2. This may allow for the reduction of the noise floor and increase of the dynamic range of pixels 114 in low-light conditions. Furthermore, by excluding capacitors 224 and 226 from the output signal propagation path, charging and discharging of capacitors is circumvented, thereby reducing power consumption in circuit 400 when it is operating in the second mode. Even further, compared to the switchable CVF solution described above in respect of FIG. 2, these effects are achieved with reduced circuit architecture.

Circuit 400 and the method of operating it may be useful in conditions (e.g. in low-light situations) where motion blur, and not rolling-shutter effects, are the dominant motion artifacts and where each pixel 114 of sensor array 102 may need to have a low noise floor, low power consumption, and high dynamic range. In other words, switching operation from a global shutter mode to a rolling shutter readout mode can yield better low-light sensitivity without leaving the digital imaging system 100 susceptible to rolling-shutter artifacts. Furthermore, for applications requiring digital imaging system 100 to be in a low power idle state, the greatly reduced power consumption of circuit 400 during rolling shutter readout mode can be advantageous.

Figure 6:
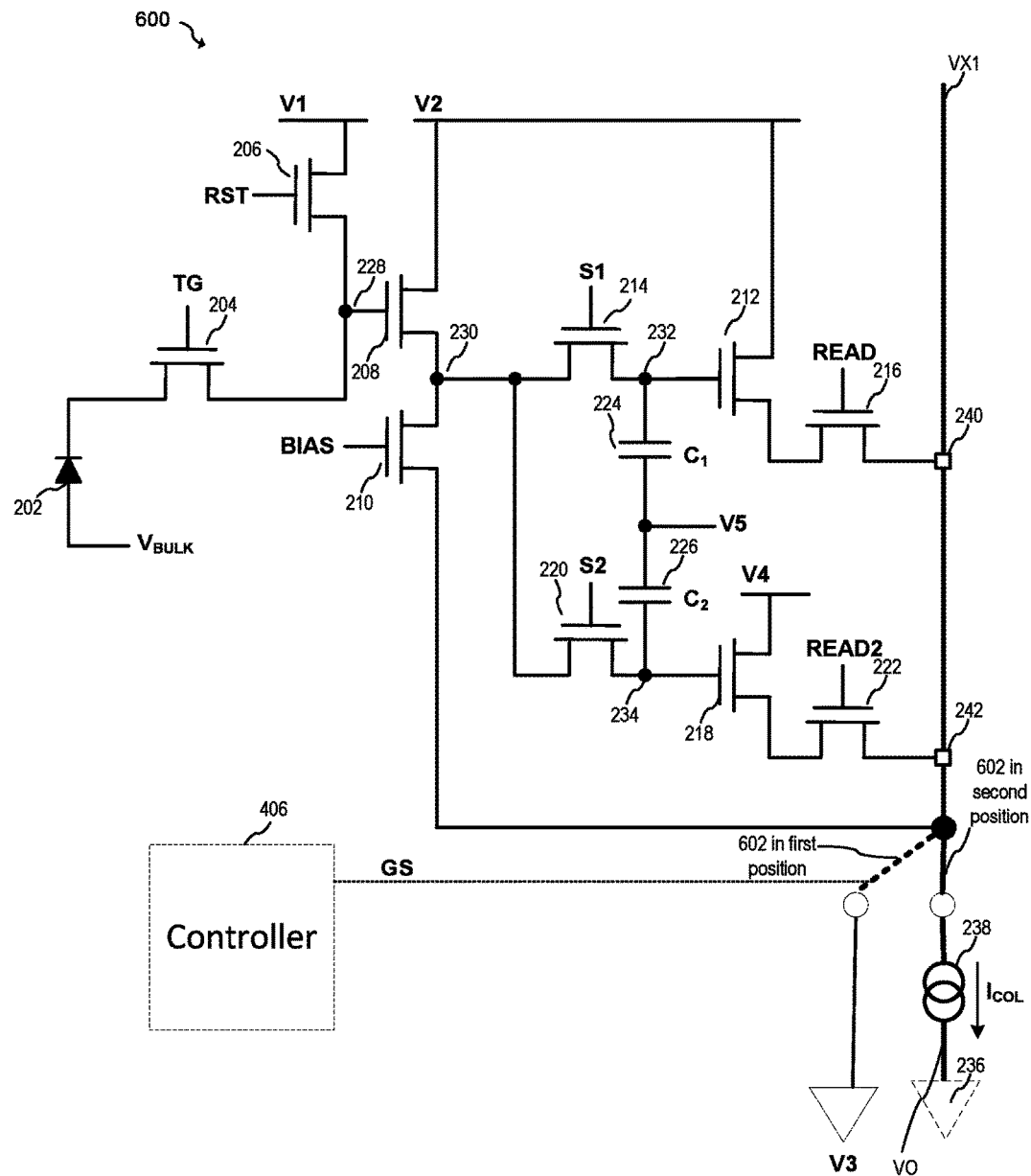
FIG. 6 schematically illustrates a circuit, including a pixel having CMOS architecture, a single column line, a second controllable switching element, and a controller, in accordance with some embodiments.

FIG. 6 schematically illustrates a circuit 600 including a pixel having a CMOS architecture, first column line VX1, second controllable switching element 602, and controller 406. Circuit 600 may be used in digital imaging system 100 in order to achieve a low noise floor (e.g. between about 1 electron and about 2 electrons), low power consumption, and high dynamic range in certain applications or environments (e.g. in low-light conditions). However, in comparison with circuit 400 in FIG. 4, circuit 600 achieves such effects without the use of second column line VX2. Instead, circuit 600 includes second controllable switching element 602, which is communicatively coupled to controller 406. Like first controllable switching element 401, second controllable switching element 602 is configured to couple the source of fourth transistor 210 to third supply voltage V3 and to output line VO (or to column current source 238) when pixels 114 operate in the first mode and the second mode, respectively.

Second controllable switching element 602 may be a programmable switch and controller 406 may be configured to change a position of second controllable switching element 602, e.g. by use of control signal GS. Second controllable switching element 602 may have a first position and a second position. In the first position, a first terminal of second controllable switching element 602 is coupled to first column line VX1, while a second terminal of second controllable switching element 602 is coupled to third supply voltage V3. In the second position, the first terminal of second controllable switching element 602 continues to be coupled to first column line VX1, while the second terminal of second controllable switching element 602 is decoupled from third supply voltage V3 and is, instead, coupled to output line VO (or to column current source 238). FIG. 6 shows the first position of second controllable switching element 602 as a dotted line and the second position of second controllable switching element 602 as a solid line. Controller 406 may be configured to switch the position of second controllable switching element 602 in response to pixels 114 of sensor array 102 operating in the first mode or the second mode.

Referring back to FIG. 3, it is noted that buffering of the reset and signal voltages onto capacitors 224 and 226 (indicated as "sample reset voltage" and "sample signal voltage") and readout of these voltages (indicated as "readout reset and signal voltages") are not concurrent or simultaneous. As such, the sources of read transistors 216 and 222 may be decoupled from output line VO (or column current source 238) during the buffering of the reset and signal voltages without affecting operation of pixel 200, as long as the source of fourth transistor 210 is coupled to third supply voltage V3 during the buffering. Furthermore, the source of fourth transistor 210 may be decoupled from third supply voltage V3 during readout of these voltages without affecting operation of pixel 200, as long as the sources of read transistors 216 and 222 are coupled to output line VO (or column current source 238) during the readout.

Based on this observation, second controllable switching element 602 may be configured to operate in the first position (i.e. the dotted line shown in FIG. 6) when the reset and signal voltages are buffered onto capacitors 224 and 226, respectively. On the other hand, while pixels 114 of sensor array 102 are still operating in the first mode, second controllable switching element 602 may be configured to operate in the second position (i.e. the sold line in FIG. 6) when the voltages, buffered onto capacitors 224 and 226, are read out. In both the buffering and the readout stages, when pixels 114 of sensor array 102 operate in the first mode, control signals similar to those shown in FIG. 3 are provided to circuit 600. As such, circuit 600 operates as described above in relation to FIGS. 2 and 3 when pixels 114 of sensor array 102 operate in the first mode.

However, when pixels 114 of sensor array 102 operate in the second mode, control signals similar to those shown in FIG. 5 and labeled "timing diagram for second mode" are provided to circuit 600. Furthermore, when pixels 114 of sensor array 102 operate in the second mode second controllable switching element 602 may be configured to operate solely in the second position. Since control signals READ and READ2 are held at a LOW voltage, the outputs of transistors 212 and 218 are disconnected from the first column line VX. Additionally, since control signals S1 and S2 are held at a LOW voltage, capacitors 224 and 226 are effectively decoupled from the output of third transistor 208. As such, transistors 212, 214, 216, 218, 220, 222, and capacitors 224 and 226 are excluded from the output signal propagation path. Consequently, circuit 600 may operate as described above in relation to FIGS. 4B and 5.

Similar to circuit 400 in FIG. 4B, control signal noise associated with control signals S1, S2, READ, and READ2, kTC noise associated with capacitors 224 and 226, and RTS noise associated with source followers 208, 212, and 218 are reduced or excluded from the output signal that is read out onto first column line VX1. This may allow for the reduction of the noise floor and increase of the dynamic range of pixels 114 in low-light conditions. Furthermore, by excluding capacitors 224 and 226 from the output signal propagation path, charging and discharging of capacitors is circumvented, thereby reducing power consumption in circuit 400 when it is operating in the second mode. Even further, compared to the switchable CVF solution described above in respect of FIG. 2, these effects are achieved with reduced circuit architecture.

Circuit 600 and the method of operating it may be useful in conditions (e.g. in low-light situations) where motion blur, and not rolling-shutter effects, are the dominant motion artifacts and where each pixel 114 of sensor array 102 needs to have a low noise floor, low power consumption, and high dynamic range. In other words, switching operation from a global shutter mode to a rolling shutter readout mode can yield better low-light sensitivity without leaving the digital imaging system 100 susceptible to rolling-shutter artifacts. Furthermore, for applications requiring digital imaging system wo to be in a low power idle state, the greatly reduced power consumption of circuit 400 during rolling shutter readout mode can be advantageous.

As shown in FIGS. 4A, 4B, and 6, circuits 400 and 600 include photodiode 202 (e.g. pinned photodiode) coupled to first source follower 208, which has an output (e.g. node 230) that is isolated from storage capacitors 224 and 226 by switches (e.g. transistors 214 and 220), respectively. Furthermore, each of the storage capacitors 224 and 226 has a corresponding output stage. In particular, storage capacitor 224 has an output stage that includes transistors 212 and 216 and has first output node 240, while storage capacitor 226 has an output stage that includes transistors 218 and 222 and has second output node 242. It is noted that while controllable switching elements 401 and 602 have been described in the context of circuits 400 and 600, it is possible to arrange capacitors 224 and 226, and transistors 212, 214, 216, 218, 220, and 222 in a number of different ways. The solution proposed in this disclosure (e.g. having a controllable switching element configured to couple the source of a bias transistor to a supply voltage and to a column current source when pixels operate in the first mode and the second mode, respectively) may be applied to any such variant, as long as there exists a pinned photodiode stage with a sense node source follower, storage capacitances isolated from the output of the sense node source follower by switches and which have their own output stage.

According to an embodiment, a circuit includes a first source follower configured to be controlled by a voltage at a first node, a photodiode controllably coupled to the first node, and a bias transistor configured to be controlled by a bias voltage. The bias transistor has a first terminal coupled to an output of the first source follower. The circuit additionally includes a storage node controllably coupled to the output of the first source follower, and an amplifier controllably coupled between the storage node and an output line. Also included in the circuit is a controllable switching element configured to couple a second terminal of the bias transistor to a supply voltage in response to a pixel operating in a first mode, and to couple the second terminal of the bias transistor to the output line in response to the pixel operating in a second mode.

According to an embodiment, a method of operating a circuit includes controlling a first source follower using a voltage at a first node, and, in response to a pixel switching operation from a first mode to a second mode, decoupling a terminal of a capacitor from an output of the first source follower, and decoupling an output of a second source follower from an output line, the second source follower controllably coupled between the terminal of the capacitor and the output line. The method further includes coupling a source of a bias transistor to the output line. A drain of the bias transistor is tied to the output of the first source follower. The method additionally includes performing a read operation on output of the first source follower using the bias transistor as a switch configured to couple the output of the first source follower to the output line.

According to an embodiment, a circuit includes a photodiode, a first source follower controlled by a voltage at a sense node, and a transfer gate transistor configured to transfer a charge from the photodiode to the sense node. The circuit also includes a bias transistor having a first terminal coupled to an output of the first source follower, a second source follower coupled to and controlled by the output of the first source follower, and a capacitor controllably coupled between the output of the first source follower and the second source follower. The circuit additionally includes a controllable switching element configured to couple a second terminal of the bias transistor to a voltage supply line in response to a pixel operating in a first mode, and to couple the second terminal of the bias transistor to a current source in response to the pixel operating in a second mode.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
a first source follower configured to be controlled by a voltage at a first node;
a photodiode controllably coupled to the first node;
a bias transistor configured to be controlled by a bias voltage, the bias transistor having a first terminal coupled to an output of the first source follower;

a storage node controllably coupled to the output of the first source follower;

an amplifier controllably coupled between the storage node and an output line; and a controllable switching element configured to couple a second terminal of the bias transistor to a supply voltage in response to a pixel operating in a first mode, and to couple the second terminal of the bias transistor to the output line in response to the pixel operating in a second mode, wherein the first mode is a global shutter mode of the pixel, and the second mode is a rolling shutter readout mode of the pixel.

2. The circuit of claim 1, wherein the controllable switching element is configured to decouple the second terminal of the bias transistor from the supply voltage in response to the pixel operating in the second mode.

3. The circuit of claim 1, wherein the amplifier is configured to decouple from the output line in response to the pixel operating in the second mode.

4. The circuit of claim 1, wherein the storage node is configured to decouple from the output of the first source follower in response to the pixel operating in the second mode.

5. The circuit of claim 1, further comprising a controller communicatively coupled to the controllable switching element, the controller configured to cause the controllable switching element to couple the second terminal of the bias transistor to the supply voltage in response to the pixel operating in the first mode, and to couple the second terminal of the bias transistor to the output line in response to the pixel operating in the second mode.

6. The circuit of claim 1, wherein the controllable switching element comprises a first switch and a second switch different from the first switch.

7. The circuit of claim 6, wherein the pixel operates in the first mode, and wherein the first switch couples the second terminal of the bias transistor to the supply voltage, and the second switch couples an output of the amplifier to the output line.

8. The circuit of claim 6, wherein the pixel operates in the second mode, and wherein the first switch couples the second terminal of the bias transistor to the output line, and the second switch decouples an output of the amplifier from the output line.

9. The circuit of claim 1, wherein the controllable switching element comprises a switch configured to operate in a first position and a second position in response to the pixel operating in the first mode, the switch further configured to operate in the second position, and not in the first position, in response to the pixel operating in the second mode.

10. The circuit of claim 9, wherein the pixel operates in the first mode, wherein the switch, in the first position, couples the second terminal of the bias transistor to the supply voltage in response to a voltage being stored at the storage node, and wherein the switch, in the second position, couples an output of the amplifier to the output line in response to the voltage at the storage node being amplified by the amplifier.

11. The circuit of claim 9, wherein the pixel operates in the second mode, and wherein the switch, in the second position, decouples the second terminal of the bias transistor from the supply voltage, and couples the second terminal of the bias transistor to the output line.

12. The circuit of claim 1, further comprising a reset transistor configured to be controlled by a reset signal, the reset transistor having a first terminal configured to be coupled to a reset voltage and a second terminal coupled to the first node.

13. The circuit of claim 1, wherein the photodiode is controllably coupled to the first node via a transfer gate transistor configured to be controlled by a transfer gate voltage.

14. The circuit of claim 1, wherein the storage node comprises a terminal of a capacitor controllably coupled to the output of the first source follower, the terminal of the capacitor being coupled to an input of the amplifier.

15. The circuit of claim 14, wherein the capacitor is configured to be decoupled from the output of the first source follower in response to the pixel operating in the second mode.

16. The circuit of claim 1, wherein the amplifier comprises a second source follower configured to be controlled by a voltage at the storage node, wherein an output of the second source follower is controllably coupled to the output line.

17. The circuit of claim 16, wherein the second source follower is configured to be decoupled from the output line in response to the pixel operating in the second mode.

18. A method of operating a circuit, the method comprising:

controlling a first source follower using a voltage at a first node; and in response to a pixel switching operation from a first mode to a second mode:

decoupling a terminal of a capacitor from an output of the first source follower;

decoupling an output of a second source follower from an output line, the second source follower controllably coupled between the terminal of the capacitor and the output line;

coupling a source of a bias transistor to the output line, wherein a drain of the bias transistor is tied to the output of the first source follower; and performing a read operation on output of the first source follower using the bias transistor as a switch configured to couple the output of the first source follower to the output line.

19. The method of claim 18, further comprising decoupling the source of the bias transistor from a supply voltage in response to the pixel switching operation from the first mode to the second mode.

20. The method of claim 18, wherein coupling the source of the bias transistor to the output line comprises changing a position of at least one controllable switch to couple the source of the bias transistor to the output line in response to a control signal provided by a controller.

21. The method of claim 20, wherein changing the position of the at least one controllable switch decouples the source of the bias transistor from a supply voltage.

22. The method of claim 18, further comprising coupling an output of a photodiode to the first node.

23. The method of claim 22, wherein performing the read operation comprises reading out a signal voltage of the photodiode.

24. The method of claim 18, further comprising coupling a supply voltage to the first node and decoupling an output voltage of a photodiode from the first node.

25. The method of claim 24, wherein performing the read operation comprises readout out a black level noise offset of the pixel.

26. The method of claim 18, wherein the first mode is a global shutter mode of the pixel, and the second mode is a rolling shutter readout mode of the pixel.

27. A circuit, comprising:
- a photodiode, the photodiode being a photo-sensitive element of a pixel configured to operate in a first mode and in a second mode different from the first mode;
- a first source follower controlled by a voltage at a sense node;
- a transfer gate transistor configured to transfer a charge from the photodiode to the sense node;
- a bias transistor having a first terminal coupled to an output of the first source follower;
- a second source follower coupled to and controlled by the output of the first source follower;
- a capacitor controllably coupled between the output of the first source follower and the second source follower, wherein a terminal of the capacitor functioning as a storage node is configured to be decoupled from the output of the first source follower in response to the pixel operating in the second mode; and
- a controllable switching element configured to couple a second terminal of the bias transistor to a voltage supply line in response to the pixel operating in the first mode, and to couple the second terminal of the bias transistor to a current source in response to the pixel operating in the second mode.

28. The circuit of claim 27, wherein the controllable switching element is configured to decouple the second terminal of the bias transistor from the voltage supply line in response to the pixel operating in the second mode.

29. The circuit of claim 27, wherein the pixel operates in the first mode and the controllable switching element comprises a first switch and a second switch, the first switch being configured to couple the second terminal of the bias transistor to the voltage supply line, the second switch being configured to couple an output of the second source follower to the current source.

30. The circuit of claim 27, wherein the pixel operates in the second mode and the controllable switching element comprises a first switch and a second switch, the first switch being configured to couple the second terminal of the bias transistor to the current source, the second switch being configured to decouple an output of the second source follower from the current source.

31. The circuit of claim 27, wherein the controllable switching element comprises a switch configured to operate in a first position that couples the second terminal of the bias transistor to the voltage supply line, and a second position that couples the bias transistor to the current source.

32. The circuit of claim 31, wherein the pixel operates in the first mode, wherein the switch is configured to operate in the first position when a voltage at the output of the first source follower is being stored in the capacitor, and wherein the switch is configured to operate in the second position when the voltage stored in the capacitor is amplified by the second source follower.

33. The circuit of claim 31, wherein the pixel operates in the second mode, wherein the switch is configured to operate in the second position and not in the first position when the voltage at the sense node is amplified by the first source follower.

* * * * *